United States Patent
Lu et al.

(10) Patent No.: US 11,538,840 B2
(45) Date of Patent: Dec. 27, 2022

(54) COLOR FILTERS DISPOSED IN HOLES OF A LIGHT COLLIMATOR, MANUFACTURING METHOD OF THE SAME AND BIOMETRIC IDENTIFICATION APPARATUS USING THE SAME

(71) Applicant: VANGUARD INTERNATIONAL SEMICONDUCTOR CORPORATION, Hsinchu (TW)

(72) Inventors: Wu-Hsi Lu, New Taipei (TW); Chung-Ren Lao, Taichung (TW); Chih-Cherng Liao, Jhudong Township, Hsinchu County (TW); Shih-Hao Liu, Taoyuan (TW); Ming-Cheng Lo, New Taipei (TW); Wei-Lun Chung, Lukang Township, Changhua County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 427 days.

(21) Appl. No.: 16/541,889

(22) Filed: Aug. 15, 2019

(65) Prior Publication Data
US 2021/0050378 A1     Feb. 18, 2021

(51) Int. Cl.
*H01L 27/146*     (2006.01)
*G06V 40/10*     (2022.01)

(52) U.S. Cl.
CPC ........ *H01L 27/14625* (2013.01); *G06V 40/10* (2022.01); *H01L 27/14621* (2013.01);
(Continued)

(58) Field of Classification Search
CPC ......... H01L 27/14625; H01L 27/14621; H01L 27/14623; H01L 27/14678;
(Continued)

(56) References Cited

U.S. PATENT DOCUMENTS

| 8,530,266 B1 * | 9/2013 | Chen ................ H01L 27/14629 438/73 |
| 9,122,966 B2 | 9/2015 | Glaser |

(Continued)

FOREIGN PATENT DOCUMENTS

| TW | 201812642 A | 4/2018 |
| TW | 201908776 A | 3/2019 |

(Continued)

OTHER PUBLICATIONS

Taiwanese Office Action and Search Report dated Feb. 27, 2020, for Taiwanese Application No. 108120816.

*Primary Examiner* — Jennifer D Bennett
(74) *Attorney, Agent, or Firm* — Birch, Stewart, Kolasch & Birch, LLP

(57) ABSTRACT

A semiconductor device includes a conductive substrate and an encapsulation structure. The conductive substrate has a plurality of pixels. The encapsulation structure is disposed on the conductive substrate and includes at least one light-collimating unit. The light-collimating unit includes a transparent substrate and a patterned light-shielding layer. The patterned light-shielding layer is disposed on the transparent substrate. The patterned light-shielding layer has a plurality of holes disposed to correspond to the pixels.

20 Claims, 5 Drawing Sheets

(52) U.S. Cl.
CPC .. *H01L 27/14623* (2013.01); *H01L 27/14678* (2013.01); *H01L 27/14685* (2013.01)

(58) Field of Classification Search
CPC ........ H01L 27/14685; H01L 27/14683; G06K 9/00885; G06K 9/00013; G06V 40/10
See application file for complete search history.

(56) References Cited

U.S. PATENT DOCUMENTS

| | | | |
|---|---|---|---|
| 2016/0098140 A1 | 4/2016 | Lee et al. | |
| 2017/0025460 A1* | 1/2017 | Chen | H01L 27/14687 |
| 2017/0220840 A1* | 8/2017 | Wickboldt | H01L 27/3234 |
| 2018/0068160 A1* | 3/2018 | Wu | G06K 9/00201 |
| 2018/0157889 A1* | 6/2018 | MacDonald | G06K 9/0008 |
| 2018/0270403 A1* | 9/2018 | Chung | H01L 27/14625 |
| 2018/0373945 A1* | 12/2018 | Wu | G06V 40/70 |
| 2019/0180072 A1* | 6/2019 | Fomani | G06V 40/1324 |
| 2020/0279090 A1* | 9/2020 | He | G06K 9/00087 |

FOREIGN PATENT DOCUMENTS

| | | |
|---|---|---|
| WO | WO 2013/054010 A1 | 4/2013 |
| WO | WO 2018/042778 A1 | 3/2018 |

* cited by examiner

COLOR FILTERS DISPOSED IN HOLES OF A LIGHT COLLIMATOR, MANUFACTURING METHOD OF THE SAME AND BIOMETRIC IDENTIFICATION APPARATUS USING THE SAME

BACKGROUND

Technical Field

Embodiments of the present disclosure relate to a semiconductor device, and in particular they relate to a semiconductor device that has a function of light collimation, a manufacturing method of the same, and a biometric identification apparatus using the same.

Description of the Related Art

Semiconductor devices may be used in a variety of applications. For example, a semiconductor device may be used as a biometric identification apparatus (e.g., at least one portion of a fingerprint identification apparatus, a facial-recognition apparatus, an iris scanner, etc.) The biometric identification apparatus may be composed of a large number of optical components. For example, the optical components may include light collimators. The light collimators may be used to collimate the light for reducing the energy lost due to light divergence. Therefore, the light collimators may be applied in a biometric identification apparatus (e.g., a fingerprint identification apparatus) to enhance the efficiency of identification.

However, existing light collimators have not been satisfactory in every respect.

SUMMARY

Some embodiments of the present disclosure include a semiconductor device. The semiconductor device includes a conductive substrate and an encapsulation structure. The conductive substrate has a plurality of pixels. The encapsulation structure is disposed on the conductive substrate and includes at least one light-collimating unit. The light-collimating unit includes a transparent substrate and a patterned light-shielding layer. The patterned light-shielding layer is disposed on the transparent substrate. The patterned light-shielding layer has a plurality of holes disposed to correspond to the pixels.

Some embodiments of the present disclosure include a manufacturing method of a semiconductor device. The manufacturing method of the semiconductor device includes forming a light-shielding material on a transparent substrate. The manufacturing method of the semiconductor device further includes patterning the light-shielding material to form a patterned light-shielding layer having a plurality of holes. The transparent substrate and the patterned light-shielding layer define a light-collimating unit. The manufacturing method of the semiconductor device includes forming the light-collimating unit on a conductive substrate. The conductive substrate has a plurality of pixels, and the holes are disposed to correspond to the pixels.

Some embodiments of the present disclosure include a biometric identification apparatus. The biometric identification apparatus includes the semiconductor device mentioned above. The biometric identification apparatus also includes a light source layer disposed on the semiconductor device. The biometric identification apparatus further includes a cover plate disposed on the light source layer.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
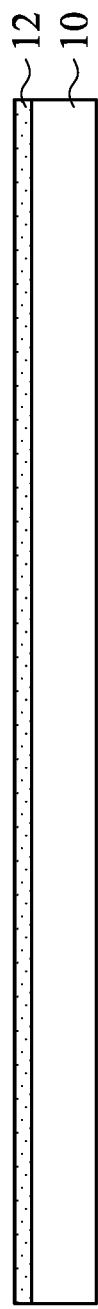
FIG. 1 to FIG. 5 are a series of cross-sectional views illustrating a method for forming a semiconductor device according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 to FIG. 5 are a series of cross-sectional views illustrating a method for forming a semiconductor device 100 according to an embodiment of the present disclosure. It should be noted that some components may be omitted in FIG. 1 to FIG. 5, for the sake of brevity.

As shown in FIG. 1, a transparent substrate 10 is provided. In some embodiments, the material of the transparent substrate 10 may include glass, quartz, polyimide (PI), liquid-crystal polymer (LCP), polycarbonate (PC), polypropylene (PP), polyethylene terephthalate (PET), any other applicable material or a combination thereof, but the present disclosure is not limited thereto.

Then, a light-shielding material 12 is formed on the transparent substrate 10. In some embodiments, the light-shielding material 12 may include a metal, such as copper (Cu), silver (Ag), and so on, but the present disclosure is not limited thereto. In some embodiments, the light-shielding material 12 may include a photoresist (e.g., black photoresist, or other applicable photoresist which is not transparent), an ink (e.g., black ink, or any other applicable ink which is not transparent), molding compound (e.g., black molding compound, or any other applicable molding compound which is not transparent), solder mask (e.g., black solder mask, or any other applicable solder mask which is not transparent), epoxy polymer, any other applicable material, or a combination thereof, but the present disclosure is not limited thereto.

In some embodiments, the light-shielding material 12 may include a light curing material, a thermal curing material, or a combination thereof. For example, the light-shielding material 12 may be coated on the transparent substrate 10 by a spin-on coating process, but the present disclosure is not limited thereto.

Figure 2:
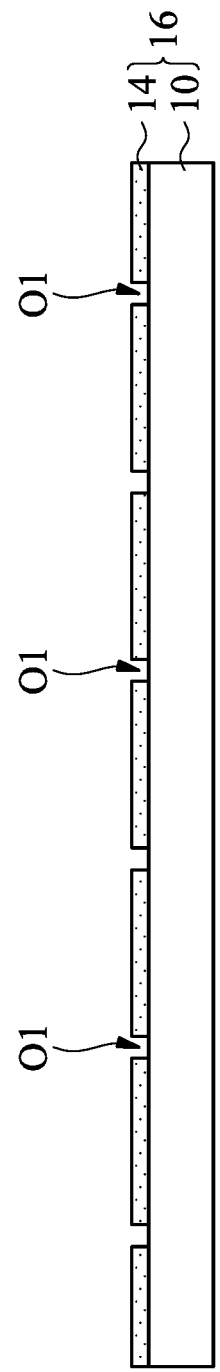

Then, a patterning process may be performed to pattern the light-shielding material 12 and form a patterned light-shielding layer 14 having a plurality of holes O1 as shown in FIG. 2. In more detail, some portions of the light-shielding material 12 may be removed in the pattering process to form the plurality of holes O1. In some embodiments, the patterning process may include soft baking, mask aligning, exposure, post-exposure baking, developing, rinsing, drying, any other applicable process, or a combination thereof, but the present disclosure is not limited thereto. In some embodiments, the transparent substrate 10 and the patterned light-shielding layer 14 may define a light-collimating unit 16 (which will be referred to as the first light-collimating unit 16 hereinafter).

In some embodiments, the transparent substrate 10 may be lapped after the light-shielding material 12 is patterned, so that the transparent substrate 10 may have a predetermined thickness (e.g., 80 μm), but the present disclosure is not limited thereto.

Figure 3:
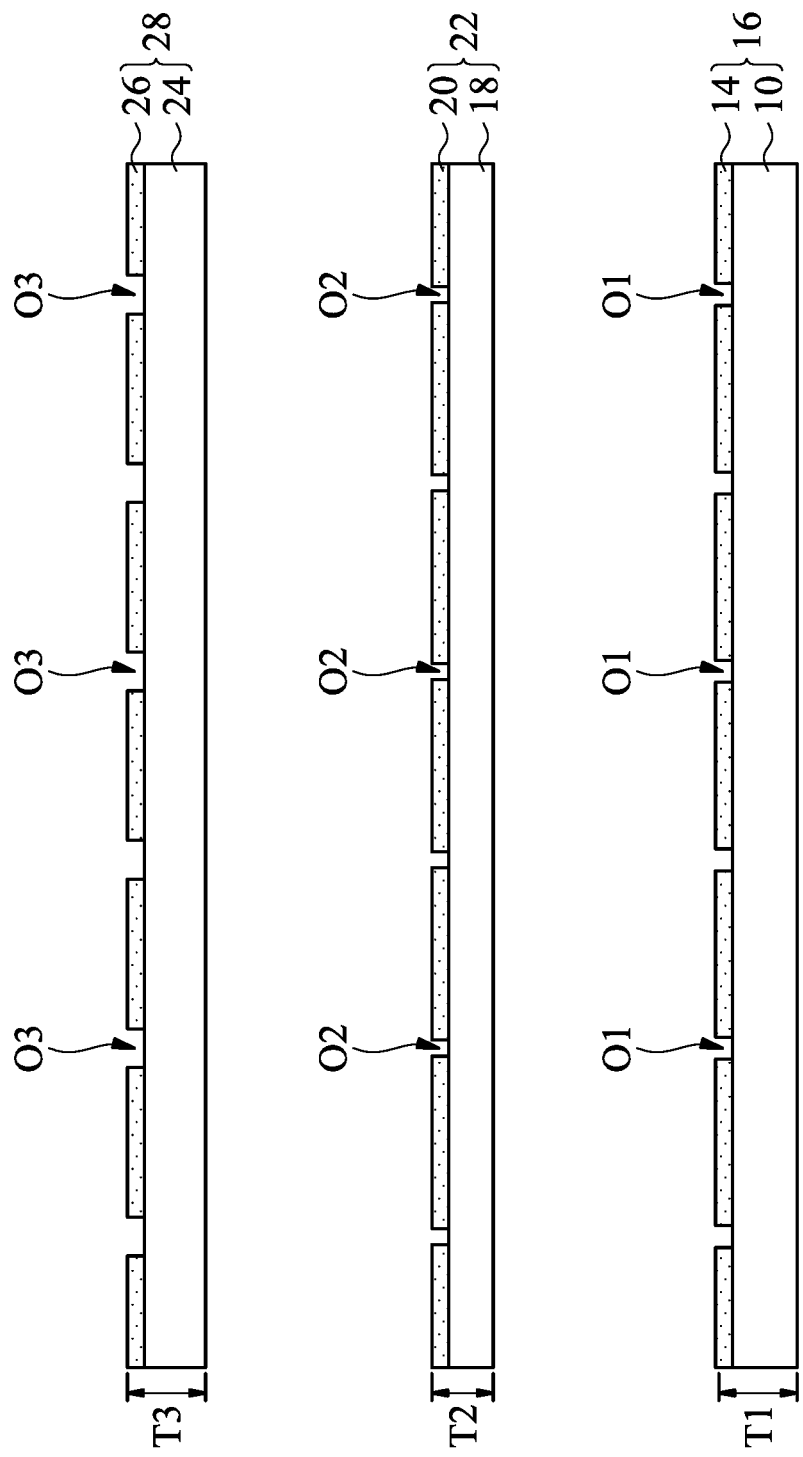

As shown in FIG. 3, in some embodiments, the steps above may be repeated to form a plurality of light-collimating units. For example, another transparent substrate 18 may be provided, and the light-shielding material 12 may be formed on the transparent substrate 18 (e.g., by a spin-on coating process); then, a patterning process may be performed to pattern the light-shielding material 12 and form a patterned light-shielding layer 20 having a plurality of holes O2. The transparent substrate 18 and the patterned light-shielding layer 20 may define a light-collimating unit 22 (which will be referred to as the second light-collimating unit 22 hereinafter). Similarly, the transparent substrate 18 may be lapped after the light-shielding material 12 is patterned, so that the transparent substrate 18 may have a predetermined thickness. In some embodiments, the thickness of the transparent substrate 18 may be the same as or different from the thickness of the transparent substrate 10. In some embodiments, the thickness of the patterned light-shielding layer 20 may be the same as or different from the thickness of the patterned light-shielding layer 14.

In some embodiments, a third light-collimating unit 28 may be further formed. The third light-collimating unit 28 may include a transparent substrate 24 and a patterned light-shielding layer 26. The patterned light-shielding layer 26 is disposed on the transparent substrate 24, and the patterned light-shielding layer 26 has a plurality of holes O3, but the present disclosure is not limited thereto. In some embodiments, the thickness of the transparent substrate 24 may be the same as or different from the thickness of the transparent substrate 18 and the thickness of the transparent substrate 10. In some embodiments, the thickness of the patterned light-shielding layer 26 may be the same as or different from the thickness of the patterned light-shielding layer 20 and the thickness of the patterned light-shielding layer 14.

Since the thickness of the transparent substrate 10, the thickness of the transparent substrate 18 and the thickness of the transparent substrate 24 may be different from each other, and the thickness of the patterned light-shielding layer 14, the thickness of the patterned light-shielding layer 20 and the thickness of the patterned light-shielding layer 26 may be different from each other, the thickness T1 of the first light-collimating unit 16, the thickness T2 of the second light-collimating unit 22 and the thickness T3 of the third light-collimating unit 28 may be different from each other. Here, the thickness of the light-collimating unit is referred to the sum of the thickness of the transparent substrate and the thickness of the patterned light-shielding layer.

In some embodiments, the cross-sectional areas of the holes in the same patterned light-shielding layer are the same. However, the cross-sectional areas of the holes in different patterned light-shielding layers may be different. For example, the cross-sectional area of the hole O2 of the patterned light-shielding layer 20 may be smaller than the cross-sectional area of the hole O1 of the patterned light-shielding layer 14, and the cross-sectional area of the hole O1 of the patterned light-shielding layer 14 may be smaller than the cross-sectional area of the hole O3 of the patterned light-shielding layer 26, but the present disclosure is not limited thereto.

In some embodiments, a plurality of color filter layers (not shown) may be formed in the holes O1 of the patterned light-shielding layer 14, in the holes O2 of the patterned light-shielding layer 20 or in the holes O3 of the patterned light-shielding layer 26. The color filter layer may be made of a polymer material or any other applicable material, which may be configured to limit the passage of light, so that light with a specific wavelength may pass through the color filter layer, and light with other wavelengths may be isolated, but the present disclosure is not limited thereto.

Figure 4:
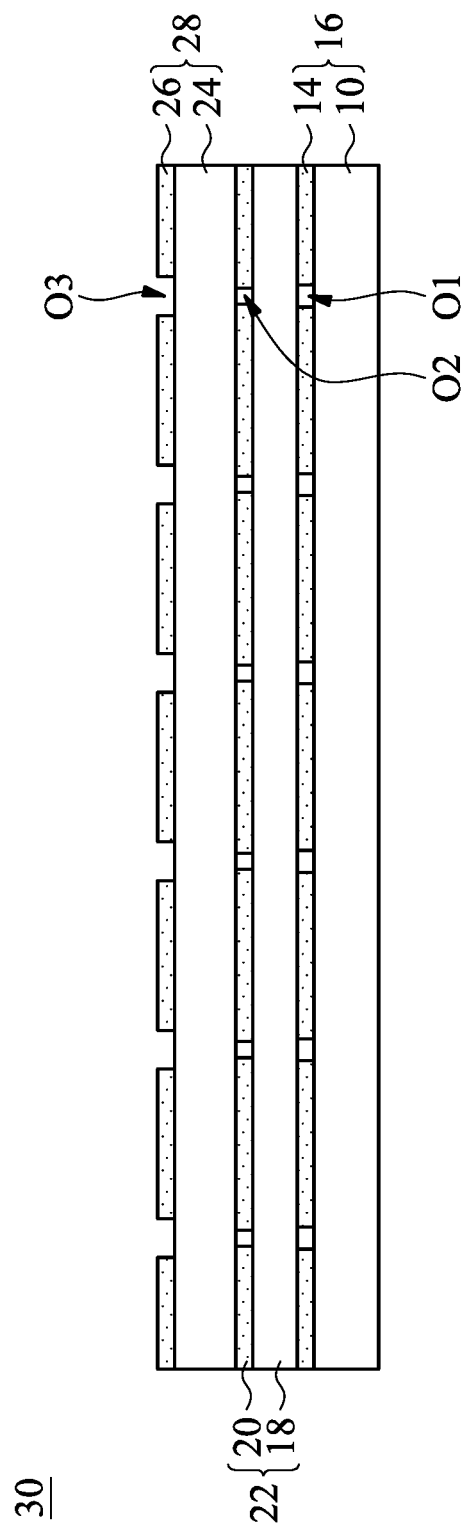

As shown in FIG. 4, the first light-collimating unit 16, the second light-collimating unit 22 and the third light-collimating unit 28 may be stacked on each other and encapsulated to form an encapsulation structure 30. In some embodiments, epoxy resin, any other applicable encapsulation material, or a combination thereof may be formed between the first light-collimating unit 16 and the second light-collimating unit 22 and between the second light-collimating unit 22 and the third light-collimating unit 28 to form the encapsulation structure 30, but the present disclosure is not limited thereto.

In some embodiments, the holes O1 of the patterned light-shielding layer 14, the holes O2 of the patterned light-shielding layer 20 and the holes O3 of the patterned light-shielding layer 26 may be disposed to correspond to each other. It should be noted that the second light-collimating unit 22 is disposed on the first light-collimating unit 16 and the third light-collimating unit 28 is disposed on the second light-collimating unit 22 in the embodiment shown in FIG. 4, so that the patterned light-shielding layer 14 may be disposed between the transparent substrate 10 and the transparent substrate 18 and the patterned light-shielding layer 20 may be disposed between the transparent substrate 18 and the transparent substrate 24, but the present disclosure is not limited thereto.

In some embodiments, the first light-collimating unit 16, the second light-collimating unit 22 and the third light-collimating unit 28 may be stacked and encapsulated in other orders. Moreover, the number of the light-collimating units of the encapsulation structure 30 is not limited to three. In some embodiments, the encapsulation structure 30 may have one light-collimating unit, two light-collimating units, or the encapsulation structure 30 may have more than two light-collimating units.

Figure 5:
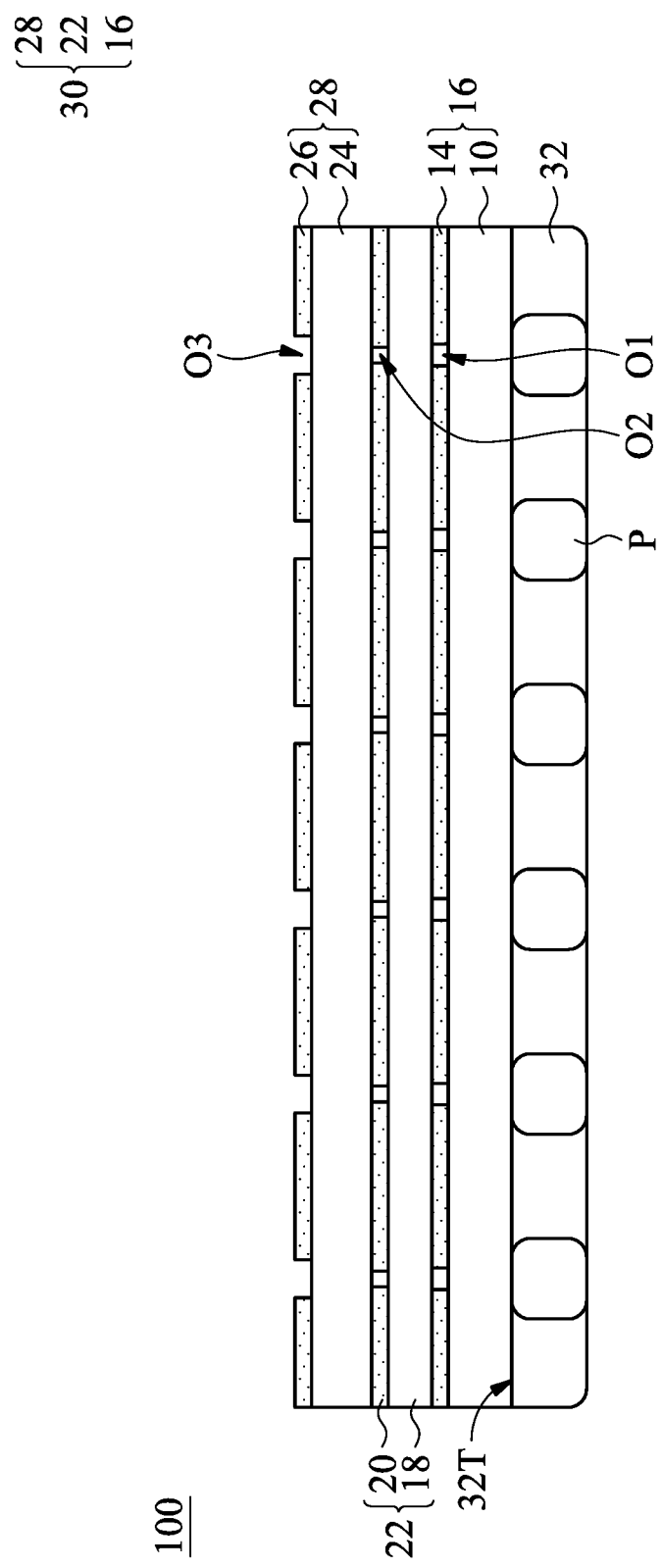

As shown in FIG. 5, the encapsulation structure 30 is formed on a conductive substrate 32 to form the semiconductor device 100. In some embodiments, the conductive substrate 32 may include an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof, but the present disclosure is not limited thereto. In some embodiments, the conductive substrate 32 may be a semiconductor-on-insulator (SOI) substrate. The semiconductor-on-insulator substrate may include a bottom substrate, a buried oxide layer disposed on the bottom substrate, and a semiconductor layer disposed on the buried oxide layer. In some embodiments, the conductive substrate 32 may be a semiconductor wafer (e.g., a silicon wafer, or any other applicable semiconductor wafer).

In some embodiments, the conductive substrate 32 may include various p-type doped regions and/or n-type doped regions formed by a process such as an ion implantation process and/or a diffusion process. For example, the doped regions may be configured to form a transistor, a photodiode, and/or a light-emitting diode, but the present disclosure is not limited thereto.

In some embodiments, the conductive substrate 32 may include various isolation features to separate various device regions in the conductive substrate 32. For example, the isolation features may include a shallow trench isolation (STI) feature, but the present disclosure is not limited thereto. In some embodiments, the formation of a shallow trench isolation (STI) feature may include etching a trench in the conductive substrate 32 and filling in the trench with insulating materials (e.g., silicon oxide, silicon nitride, or silicon oxynitride). The filled trench may have a multi-layer structure, such as a thermal oxide liner layer with silicon nitride filling the trench. A chemical mechanical polishing (CMP) process may be performed to polish back excessive insulating materials and planarize the top surface of the isolation features.

In some embodiments, the conductive substrate 32 may include various conductive features (e.g., conductive lines or vias). For example, the conductive features may be made of aluminum (Al), copper (Cu), tungsten (W), an alloy thereof, any other applicable conductive material, or a combination thereof.

In the embodiment, the conductive substrate 32 may include a plurality of pixels P that may be arranged in an array, but the present disclosure is not limited thereto. In some embodiments, each of the pixels P of the conductive substrate 32 may include or correspond to at least one photodiode and/or other applicable elements, which may convert the received light signals into electric current signals.

As shown in FIG. 5, the holes O1 of the patterned light-shielding layer 14, the holes O2 of the patterned light-shielding layer 20 and the holes O3 of the patterned light-shielding layer 26 may be disposed to correspond to the pixels P. In other words, the projection of the holes O1 of the patterned light-shielding layer 14, the projection of the holes O2 of the patterned light-shielding layer 20 and the projection of the holes O3 of the patterned light-shielding layer 26 on the top surface 32T of the conductive substrate 32 may overlap the pixels.

In the embodiments of the present disclosure, the semiconductor device 100 may be used as a light collimator, and the size of the holes O1 of the patterned light-shielding layer 14, the size of the holes O2 of the patterned light-shielding layer 20 and the size of the holes O3 of the patterned light-shielding layer 26 may be adjusted in accordance with the path of the light, so that it may prevent crosstalk in the lights in the semiconductor device 100. Moreover, the encapsulation structure 30 may be formed of a plurality of light-collimating units, and each of the light-collimating units has smaller aspect ratio (e.g., between 0.5 and 15), thereby avoiding or reducing the risk of collapse of the light-collimating unit and maintaining great collimation performance of the semiconductor device 100 at the same time (i.e., the resolution of the pixels P may be improved).

Furthermore, since the light-collimating units are stacked on each other and encapsulated to form an encapsulation structure 30 first, and then the encapsulation structure 30 is combined with the conductive substrate 32, the possibility of warpage of the conductive substrate 32 may be reduced and the reliability and the uniformity of the semiconductor device 100 may be enhanced.

Figure 6:
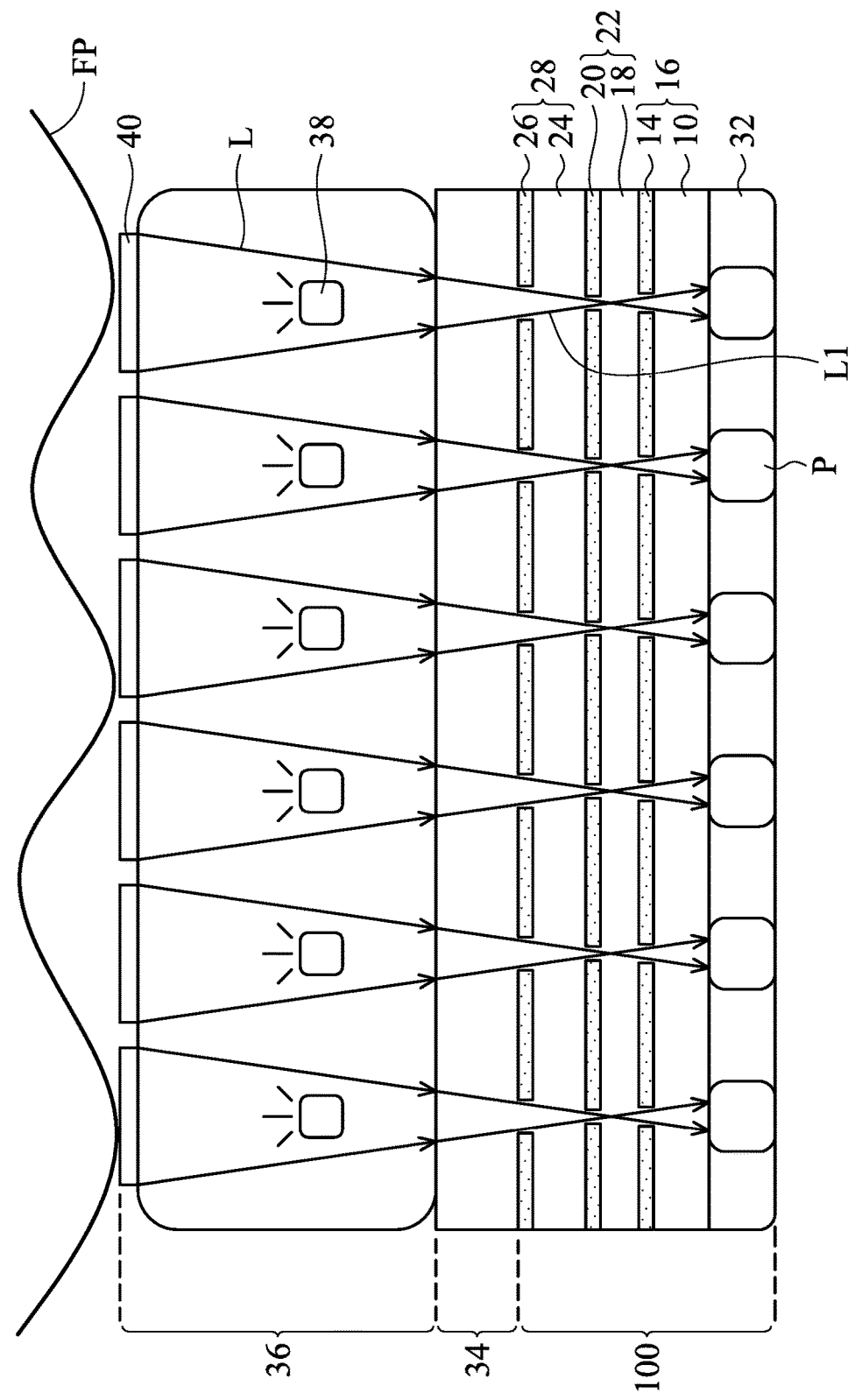
FIG. 6 is a partial cross-sectional view illustrating a biometric identification apparatus according to an embodiment of the present disclosure.

FIG. 6 is a partial cross-sectional view illustrating a biometric identification apparatus 200 according to an embodiment of the present disclosure. Here, the biometric identification apparatus 200 may be, for example, a fingerprint identification apparatus, but the present disclosure is not limited thereto. It should be noted that some components may be omitted in FIG. 6, for the sake of brevity.

As shown in FIG. 6, in some embodiments, the biometric identification apparatus 200 may include the semiconductor device 100, a color filter layer 34 and a light source layer 36.

The color filter layer 34 may be disposed between the semiconductor device 100 and the light source layer 36.

For example, the semiconductor device 100 may be formed in accordance with the steps shown in FIG. 1 to FIG. 5. Then, the color filter layer 34 may be disposed on the semiconductor device 100. The color filter layer 34 may be made of a polymer material or another suitable material, which is configured to limit the passage of light, so that light with a specific wavelength may pass through the color filter layer 34, and light with other wavelengths may be isolated.

Then, the light source layer 36 may be disposed on the color filter layer 34. In some embodiments, the light source layer 36 may include a plurality of light sources (e.g., light emitting diode, LED) 38. The light sources 38 may be arranged in an array, for example. Moreover, the light source layer 36 may further include a barrier layer, other suitable optical components, or a combination thereof (not shown). A cover plate (e.g., glass cover plate) 40 may be disposed on the top of the light source layer 36 to form a biometric identification apparatus (e.g., fingerprint identification apparatus). It should be noted that the light source layer 36 may include other elements which is not shown in FIG. 6.

For example, the lights emitted from the light sources 38 may be blocked by the biometric characteristics (e.g., fingerprints FP) from outside, and then different reflected lights L are generated and enter the color filter layer 34. The color filter layer 34 may limit the reflected lights L, so that the light L1 with the specific wavelength corresponding to the pixels P (e.g., including or corresponding to at least one photodiode/photoelectric diode (PD) and/or other suitable components) may pass through the color filter layer 34, and light with other wavelengths may be isolated. The light L1 passing through the color filter layer 34 then sequentially enter the third light-collimating unit 28, the second light-collimating unit 22 and the first light-collimating unit 16. Since the light-shielding layer 26, the light-shielding layer 20 and the light-shielding layer 14 may be black (e.g., formed of black photoresist, black ink, black molding compound or black solder mask) and the size (or the cross-sectional area) of the hole O1 of the light-shielding layer 14, the size (or the cross-sectional area) of the hole O2 of the light-shielding layer 20 and the size (or the cross-sectional area) of the hole O3 of the light-shielding layer 26 may be adjusted in accordance with the path of the light, it may eliminate crosstalk from the lights L1 and enhance the performance of the biometric identification apparatus 200.

In summary, the encapsulation structure of the semiconductor device according to the embodiments of the present disclosure may be formed of a plurality of light-collimating units, and each of the light-collimating units has smaller aspect ratio, thereby avoiding or reducing the risk of collapse of the light-collimating unit and maintaining great collimation performance of the semiconductor device at the same time. Moreover, since the light-collimating units are stacked on each other and encapsulated to form an encapsulation structure first, and then the encapsulation structure is combined with the conductive substrate, the possibility of warpage of the conductive substrate may be reduced and the reliability and the uniformity of the semiconductor device may be enhanced. Furthermore, the biometric identification apparatus using the semiconductor device according to the embodiments of the present disclosure may perform better.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
   a conductive substratehaving a plurality of pixels; and
   an encapsulation structure disposed on the conductive substrate and comprising a plurality of individual light-collimating units, wherein the individual light-collimating units are encapsulated together, wherein each of the individual light-collimating units comprises:
   a transparent substrate;
   a patterned light-shielding layer disposed on the transparent substrate and having a plurality of holes disposed to correspond to the pixels, wherein the transparent substrate of a bottommost one of the individual light-collimating units of the encapsulation structure is in contact with the conductive substrate;
   a plurality of color filter layers disposed in the holes, wherein the color filter layers is made of a first material, the transparent substrate is made of a second material different from the first material.

2. The semiconductor device according to claim 1, wherein each of the pixels comprises or corresponds to at least one photodiode.

3. The semiconductor device according to claim 1, wherein the individual light-collimating units are stacked on each other.

4. The semiconductor device according to claim 3, wherein thicknesses of the individual light-collimating units are different from each other.

5. The semiconductor device according to claim 1, wherein the encapsulation structure comprises:
   a first individual light-collimating unit comprising a first transparent substrate and a first patterned light-shielding layer disposed on the first transparent substrate, and the first patterned light-shielding layer comprising a plurality of first holes; and a second individual light-collimating unit comprising a second transparent substrate and a second patterned light-shielding layer disposed on the second transparent substrate, and the second patterned light-shielding layer comprising a plurality of second holes;

wherein the first patterned light-shielding layer is disposed between the first transparent substrate and the second transparent substrate, wherein the first transparent substrate of the first individual light-collimating unit is in contact with the conductive substrate.

6. The semiconductor device according to claim 5, wherein the first holes and the second holes are disposed to correspond to the pixels.

7. The semiconductor device according to claim 5, wherein a cross-sectional area of each of the first holes is different from a cross-sectional area of each of the second holes.

8. The semiconductor device according to claim 5, wherein a thickness of the first transparent substrate is different from a thickness of the second transparent substrate.

9. The semiconductor device according to claim 5, wherein a thickness of the first patterned light-shielding layer is different from a thickness of the second patterned light-shielding layer.

10. The semiconductor device according to claim 1 wherein a material of the transparent substrate comprises glass, quartz, polyimide, liquid-crystal polymer, polycarbonate, polypropylene or polyethylene terephthalate.

11. The semiconductor device according to claim 1 wherein a material of the patterned light-shielding layer comprises a metal, a photoresist, an ink, a molding compound, a solder mask, an epoxy resin or a combination thereof.

12. The semiconductor device according to claim 1, wherein the first material allows light with a first range of wavelengths passing through, the second material allows light with a second range of wavelengths passing through, wherein the first range of wavelengths is narrower than the second range of wavelengths.

13. A manufacturing method of a semiconductor device, comprising:
forming a light-shielding material on a transparent substrate;
patterning the light-shielding material to form a patterned light-shielding layer having a plurality of holes, wherein the transparent substrate and the patterned light-shielding layer define an individual light-collimating unit;
forming a plurality of the individual light-collimating units;
forming a plurality of color filter layers in the holes, wherein the color filter layers is made of a first material, the transparent substrate is made of a second material different from the first material;

stacking the individual light-collimating units on each other and encapsulating the individual light-collimating units stacked on each other to form an encapsulation structure; and
forming the encapsulation structure on a conductive substrate, wherein the conductive substrate has a plurality of pixels, and the holes are disposed to correspond to the pixels, wherein the transparent substrate of a bottommost one of the individual light-collimating units of the encapsulation structure is in contact with the conductive substrate.

14. The manufacturing method of the semiconductor device according to claim 13, wherein the holes in the individual light-collimating units are disposed to correspond to each other.

15. The manufacturing method of the semiconductor device according to claim 14, wherein thicknesses of the individual light-collimating units are different from each other.

16. The manufacturing method of the semiconductor device according to claim 13, further comprising:
lapping the transparent substrate.

17. The manufacturing method of the semiconductor device according to claim 13, wherein the light-shielding material is coated on the transparent substrate.

18. The manufacturing method of the semiconductor device according to claim 13, wherein the first material allows light with a first range of wavelengths passing through, the second material allows light with a second range of wavelengths passing through, wherein the second range of wavelengths comprises the first range of wavelengths.

19. A biometric identification apparatus, comprising:
a semiconductor device, comprising:
a conductive substrate having a plurality of pixels; and
an encapsulation structure disposed on the conductive substrate and comprising a plurality of individual light-collimating units, wherein the individual light-collimating units are encapsulated together, wherein each of the individual light-collimating units comprises:
a transparent substrate;
a patterned light-shielding layer disposed on the transparent substrate and having a plurality of holes disposed to correspond to the pixels, wherein the transparent substrate of a bottommost one of the individual light-collimating units of the encapsulation structure is in contact with the conductive substrate; and
a plurality of first color filter layers disposed in the holes, wherein the first color filter layers is made of a first material, the transparent substrate is made of a second material different from the first material;
a light source layer disposed on the semiconductor device; and
a cover plate disposed on the light source layer.

20. The biometric identification apparatus according to claim 19, further comprising:
a second color filter layer disposed between the semiconductor device and the cover plate.

* * * * *